(12) United States Patent
Hirabayashi et al.

(10) Patent No.: US 11,164,953 B2
(45) Date of Patent: Nov. 2, 2021

(54) SEMICONDUCTOR DEVICE

(71) Applicant: TDK Corporation, Tokyo (JP)

(72) Inventors: Jun Hirabayashi, Tokyo (JP); Minoru Fujita, Tokyo (JP); Yoshiaki Fukumitsu, Tokyo (JP)

(73) Assignee: TDK CORPORATION, Tokyo (JP)

(*) Notice: Subject to any disclaimer, the term of this patent is extended or adjusted under 35 U.S.C. 154(b) by 0 days.

(21) Appl. No.: 16/496,715

(22) PCT Filed: Jan. 26, 2018

(86) PCT No.: PCT/JP2018/002438
§ 371 (c)(1),
(2) Date: Sep. 23, 2019

(87) PCT Pub. No.: WO2018/179768
PCT Pub. Date: Oct. 4, 2018

(65) Prior Publication Data
US 2020/0111882 A1  Apr. 9, 2020

(30) Foreign Application Priority Data
Mar. 29, 2017  (JP) .............................. JP2017-064123

(51) Int. Cl.
*H01L 29/47* (2006.01)
*H01L 21/04* (2006.01)
(Continued)

(52) U.S. Cl.
CPC .......... *H01L 29/47* (2013.01); *H01L 21/0495* (2013.01); *H01L 29/06* (2013.01); *H01L 29/872* (2013.01)

(58) Field of Classification Search
CPC ....... H01L 29/47; H01L 29/06; H01L 29/872; H01L 21/0495
(Continued)

(56) References Cited

U.S. PATENT DOCUMENTS

2006/0181828 A1* 8/2006 Sato .................. H01L 27/15
361/91.1
2009/0267082 A1* 10/2009 Yamamoto .......... H01L 29/0657
(Continued)

FOREIGN PATENT DOCUMENTS

EP   2 779 242 A1    9/2014
JP   09-116133 A     5/1997
(Continued)

OTHER PUBLICATIONS

International Search Report issued in corresponding International Patent Application No. PCT/JP2018/002438, dated Mar. 27, 2018, with English translation.
(Continued)

*Primary Examiner* — Tong-Ho Kim
(74) *Attorney, Agent, or Firm* — McDermott Will & Emery LLP

(57) ABSTRACT

A semiconductor device includes a semiconductor layer including first and second electrode forming surfaces and side surface, an anode electrode formed on the first electrode forming surface, a cathode electrode formed on the second electrode forming surface; an insulating film continuously formed from the first electrode forming surface to the side surface so as to cover the first edge. The side surface of the semiconductor layer is covered with the insulating film, so that a leak current flowing along the side surface is reduced. Further, the side surface is protected by the insulating film, making cracking, chipping, cleavage, and the like less likely to occur.

7 Claims, 15 Drawing Sheets

(51) Int. Cl.
*H01L 29/872* (2006.01)
*H01L 29/06* (2006.01)

(58) Field of Classification Search
USPC .......................................... 257/471
See application file for complete search history.

(56) References Cited

U.S. PATENT DOCUMENTS

2014/0332823 A1* 11/2014 Takizawa .............. H01L 29/267
257/76
2015/0295095 A1* 10/2015 Hiyoshi ............ H01L 29/66143
257/77

FOREIGN PATENT DOCUMENTS

| | | | |
|---|---|---|---|
| JP | H09116133 A | * | 5/1997 |
| JP | 2002-353227 A | | 12/2002 |
| JP | 2004-119472 A | | 4/2004 |
| JP | 2009-267032 A | | 11/2009 |
| JP | 2013-102081 A | | 5/2013 |

OTHER PUBLICATIONS

Extended European Search Report issued in corresponding European Patent Application No. 18778040.8-1212, dated Nov. 16, 2020.

* cited by examiner

SEMICONDUCTOR DEVICE

CROSS REFERENCE

This application is the U.S. National Phase under 35 U.S.C. § 371 of International Application No. PCT/2018/002438, filed on Jan. 26, 2018, which claims the benefit of Japanese Application No. 2017-064123, filed on Mar. 29, 2017, the entire contents of each are hereby incorporated by reference.

TECHNICAL FIELD

The present invention relates to a semiconductor device and, more particularly, to a vertical semiconductor device in which current flows in the thickness direction of a substrate.

BACKGROUND ART

Power semiconductor devices require significantly large currents to be supplied as compared to general semiconductor devices and, thus, often adopt a vertical structure in which current flows in the thickness direction of a substrate. For example, Patent Document 1 discloses a diode having the vertical structure. The diode described in Patent Document 1 has a structure in which a portion corresponding to a mesa groove is covered with a protective film.

CITATION LIST

Patent Document

[Patent Document 1] JP 2002-353227 A

SUMMARY OF INVENTION

Technical Problem to be Solved by Invention

However, in the diode described in Patent Document 1, a wafer side surface as a cutting surface is exposed, so that not only a leakage current easily occurs along the side surface, but also cracking, chipping, cleavage and other defects tend to occur in the side surface.

It is therefore an object of the present invention to provide a vertical semiconductor device in which a leakage current flowing along the wafer side surface, and defects in the side surface, such as cracking, chipping and cleavage hardly occur.

Means for Solving the Problem

A semiconductor device according to the present invention includes a semiconductor layer including a first electrode forming surface, a second electrode forming surface positioned opposite to the first electrode forming surface, and a side surface having a first edge as a boundary with the first electrode forming surface and a second edge as a boundary with the second electrode forming surface; a first electrode formed on the first electrode forming surface; a second electrode formed on the second electrode forming surface; and an insulating film continuously formed from the first electrode forming surface to the side surface so as to cover the first edge.

According to the present invention, the side surface of the semiconductor layer are covered with the insulating film, so that a leak current flowing along the side surface is reduced. Further, the side surface is protected by the insulating film, making cracking, chipping, cleavage, and the like less likely to occur. In addition, the insulating film is continuously formed from the first electrode forming surface to the side surface so as to cover the first edge, the first electrode forming surface and the side surface can be covered with the insulating film seamlessly.

In the present invention, it is preferable that the semiconductor layer includes a semiconductor substrate constituting the second electrode forming surface and an epitaxial layer formed on the semiconductor substrate and constituting the first electrode forming surface, that at least apart of the first electrode comes into Schottky-contact with the epitaxial layer, and that the second electrode comes into ohmic contact with the semiconductor substrate. With this configuration, a Schottky barrier diode can be constituted.

In this case, another part of the first electrode is preferably formed on the insulating film formed on the first electrode forming surface. With this configuration, a so-called field plate structure can be obtained.

In the present invention, the semiconductor layer is preferably made of gallium oxide. With this configuration, a large band gap and a large breakdown electric field can be obtained, which is very advantageous in application to a switching element for power device.

In the present invention, the semiconductor layer may have a tapered shape in which the cross section thereof is increased from the first electrode forming surface toward the second electrode forming surface. This facilitates the formation of the insulating film on the side surface.

Advantageous Effects of the Invention

As described above, according to the present invention, there can be provided a vertical semiconductor device in which a leakage current flowing along the wafer side surface, and defects in the side surface, such as cracking, chipping and cleavage are reduced.

MODE FOR CARRYING OUT THE INVENTION

Preferred embodiments of the present invention will be explained below in detail with reference to the accompanying drawings.

Figure 1:
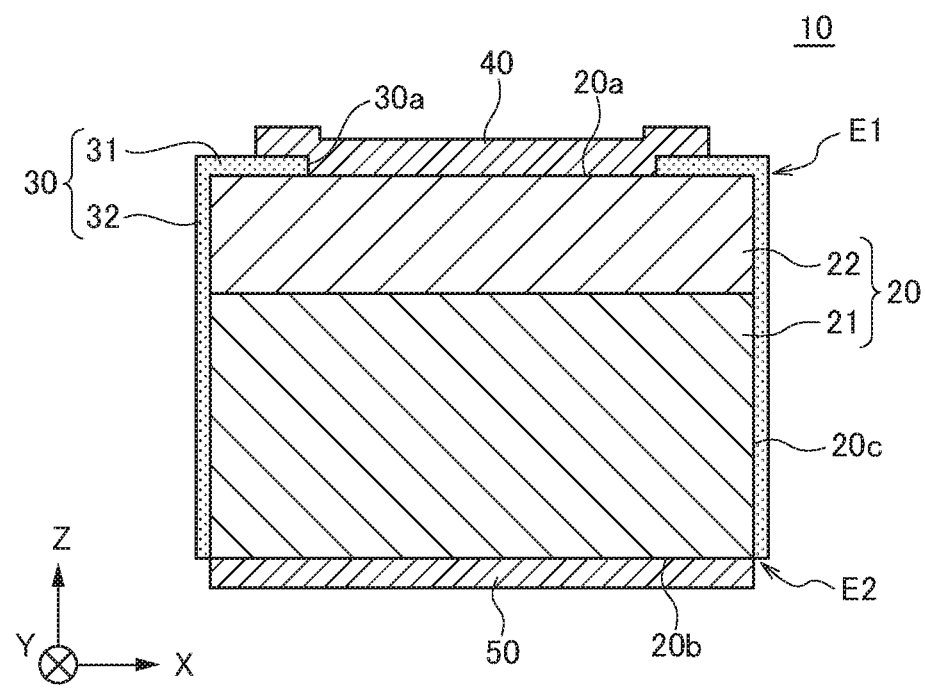
FIG. 1 is a cross-sectional view illustrating the configuration of a semiconductor device 10 according to an embodiment of the present invention.
Figure 2:
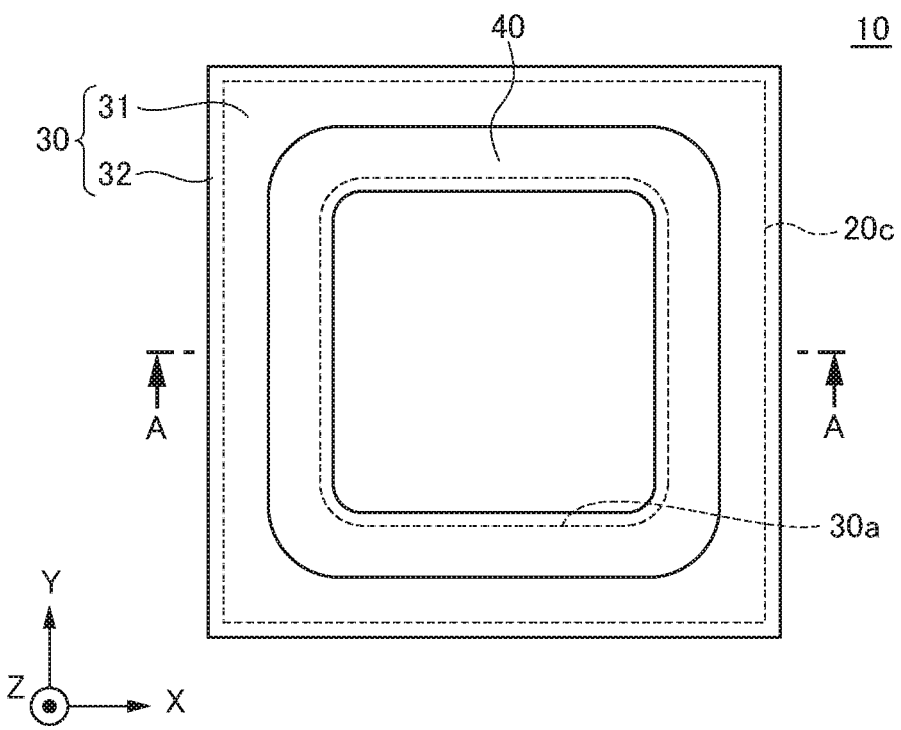
FIG. 2 is a top view of the semiconductor device 10.

FIG. 1 is a cross-sectional view illustrating the configuration of a semiconductor device 10 according to an embodiment of the present invention. FIG. 2 is a top view of the semiconductor device 10. The cross section illustrated in FIG. 1 corresponds to the cross section taken along line A-A in FIG. 2.

The semiconductor device 10 according to the present embodiment is a Schottky barrier diode and has a semiconductor layer 20 including a semiconductor substrate 21 and an epitaxial layer 22, both of which are made of gallium oxide ($\beta$-$Ga_2O_3$). In the present invention, the semiconductor layer 20 will be referred to generically as "gallium oxide substrate" according to the situation. Silicon (Si) or tin (Sn) is introduced as an n-type dopant into the semiconductor substrate 21 and the epitaxial layer 22. The concentration of the dopant is higher in the semiconductor substrate 21 than in the epitaxial layer 22, whereby the semiconductor substrate 21 and the epitaxial layer 22 function as an $n^+$ layer and an $n^-$ layer, respectively.

The semiconductor layer 20 has a first electrode forming surface 20a constituting the XY plane, a second electrode forming surface 20b positioned on the side opposite to the first electrode forming surface 20a and constituting the XY plane, and four side surfaces 20c constituting the XZ or YZ plane. The first and second electrode forming surfaces 20a and 20b are (001) planes of $\beta$-$Ga_2O_3$. The first electrode forming surface 20a is constituted by the upper surface of the epitaxial layer 22, and the second electrode forming surface 20b is constituted by the lower surface of the semiconductor substrate 21. The boundary between the first electrode forming surface 20a and the side surfaces 20c constitutes a first edge E1, and the boundary between the second electrode forming surface 20b and the side surfaces 20c constitutes a second edge E2.

As illustrated in FIGS. 1 and 2, an insulating film 30 made of $SiO_2$, $Si_3N_4$, $Al_2O_3$, $HfO_2$ or the like is formed on the first electrode forming surface 20a and the side surfaces 20c. The insulating film 30 includes a first part 31 covering the first electrode forming surface 20a and a second part 32 covering the side surfaces 20c and is continuously formed from the first electrode forming surface 20a to the side surfaces 20c so as to cover the first edge E1. The insulating film 30 is made of, e.g., silicon oxide ($SiO_2$) and has a film thickness of about 300 nm.

The first part 31 of the insulating film 30 has an opening 30a exposing therethrough the first electrode forming surface 20a. An anode electrode 40, which is a first electrode, is formed on the first electrode forming surface 20a through the opening 30a. With this configuration, the anode electrode 40 comes into Schottky-contact with the epitaxial layer 22. The anode electrode 40 is formed of a laminated film of, e.g., platinum (Pt), titanium (Ti) and aluminum (Al). The film thicknesses of the platinum layer, titanium layer and aluminum layer are, e.g., about 50 nm, 5 nm and 1 μm, respectively.

The major part of the anode electrode 40 comes into Schottky-contact with the epitaxial layer 22; the remaining part thereof covers the first part 31 of the insulating film 30. As a result, a so-called field plate structure can be obtained. Generally, in the Schottky barrier diode, an electric field is concentrated on the end portion of the anode electrode, so that an element may be destroyed when the field strength at this portion exceeds its breakdown electric field strength. However, as in the present embodiment, when the end portion of the anode electrode 40 is formed on the insulating film 30, current concentration on the end portion is alleviated to make it possible to improve reverse breakdown voltage.

On the other hand, a cathode electrode 50, which is a second electrode, is formed on the second electrode forming surface 20b of the semiconductor layer 20. The cathode electrode 50 is formed of a laminated film of, e.g., titanium (Ti), nickel (Ni) and gold (Au) and comes into ohmic contact with the semiconductor substrate 21. The film thicknesses of the titanium layer, nickel layer and gold layer are e.g., about 50 nm, 0.2 μm and 0.2 μm, respectively.

With the above configuration, the semiconductor device 10 according to the present embodiment constitutes the Schottky barrier diode. The Schottky barrier diode is used in a switching element, wherein when a forward bias is applied between the anode electrode 40 and the cathode electrode 50, a Schottky barrier at the boundary between the anode electrode 40 and the epitaxial layer 22 decreases to cause current to flow from the anode electrode 40 to the cathode electrode 50. On the other hand, when a backward bias is applied between the anode electrode 40 and the cathode electrode 50, the Schottky barrier at the boundary between the anode electrode 40 and the epitaxial layer 22 is enhanced, with the result that current hardly flows.

In the semiconductor device 10 according to the present embodiment, since the side surfaces 20c of the semiconductor layer 20 are covered with the insulating film, a leak current flowing along the side surfaces 20c decreases, and cracking, chipping, cleavage and other defects in the side surfaces 20c hardly occur. Further, the insulating film 30 is continuously formed from the first electrode forming surface 20a to the side surfaces 20c so as to cover the first edge E1, so that the effects described above are further enhanced as compared to a case where an insulating film covering the first electrode forming surface 20a and an insulating film covering the side surfaces 20c are separately formed. Further, cracking, chipping and other defects in the gallium oxide substrate at the first edge E1 are prevented.

The following describes a manufacturing method for the semiconductor device 10 according to the present embodiment.

Figure 3:
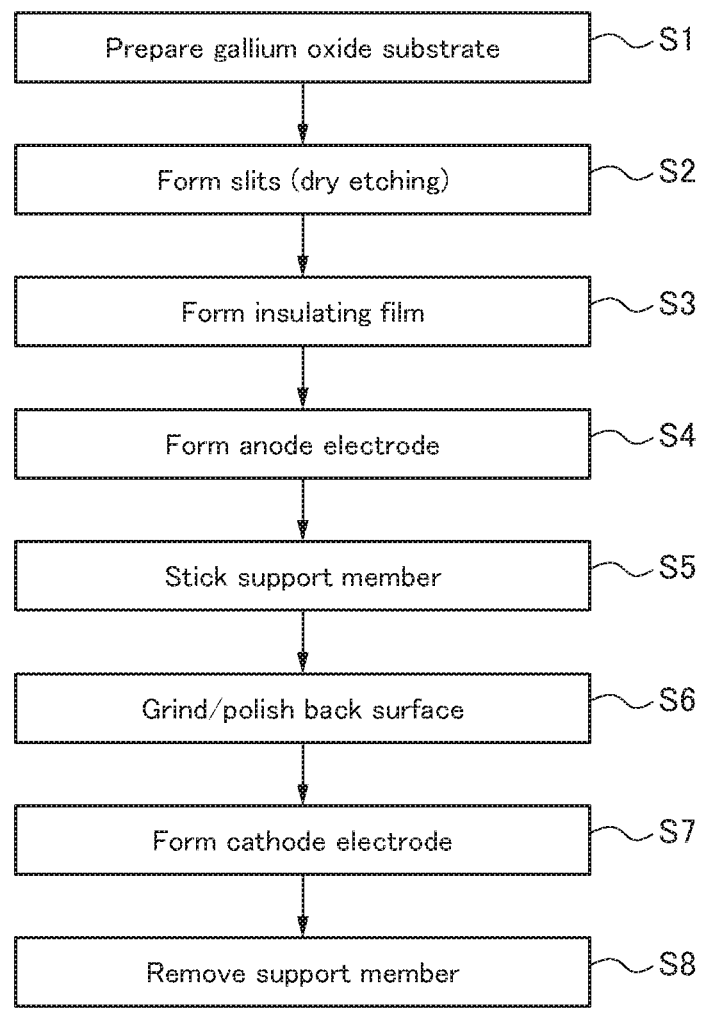
FIG. 3 is a flowchart illustrating the manufacturing process of the semiconductor device 10.

FIG. 3 is a flowchart illustrating the manufacturing process of the semiconductor device 10 according to the present embodiment.

Figure 4:
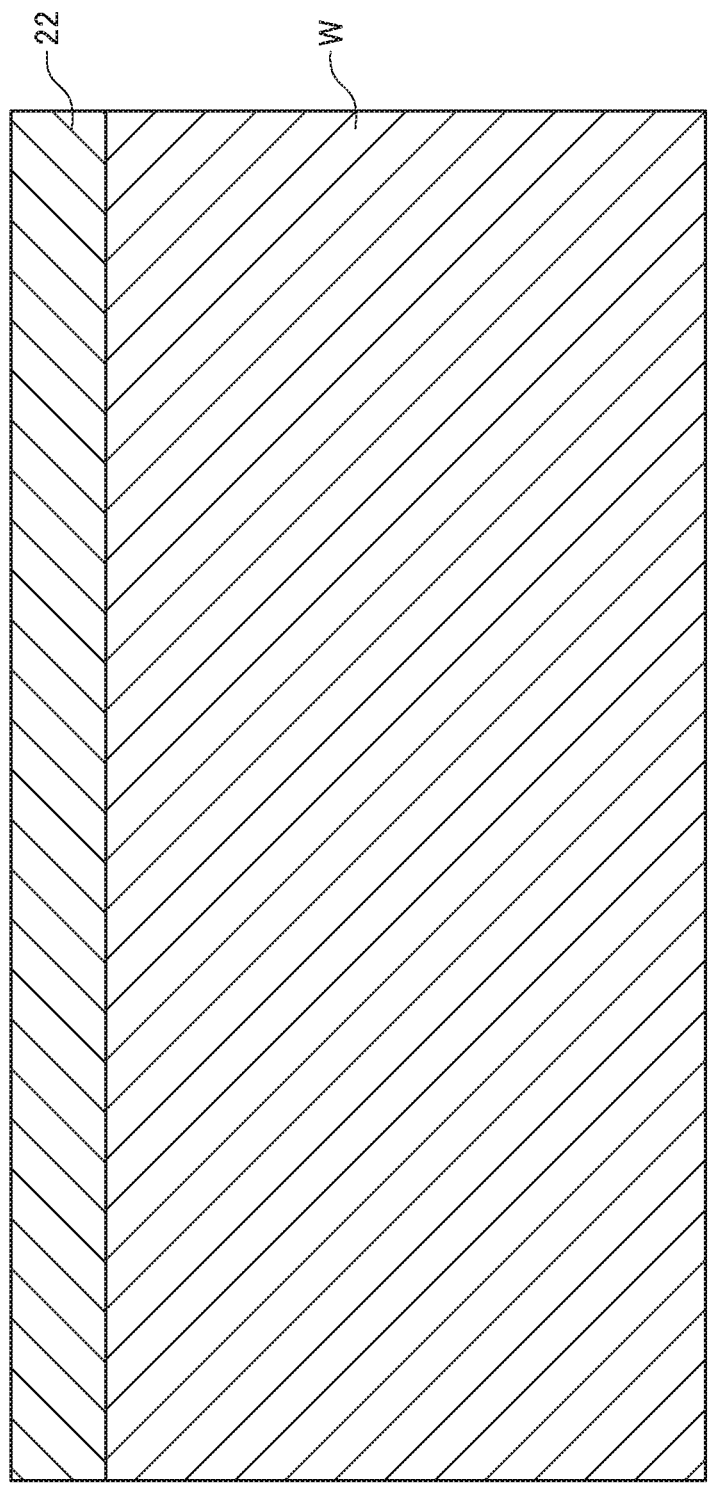
FIG. 4 is a cross-sectional view of the semiconductor device 10 during the manufacturing process.

As illustrated in FIG. 4, a gallium oxide wafer W obtained by slicing a bulk crystal grown by using a melt growth method is prepared, and the epitaxial layer 22 is formed on the surface of the gallium oxide wafer W. The epitaxial layer 22 can be formed by epitaxially growing gallium oxide on the surface of the gallium oxide wafer W using a reactive sputtering method, a PLD method, an MBE method, an MOCVD method, an HVPE method, or the like. The carrier concentration and film thickness of the epitaxial layer 22 are adjusted so as to secure a designed breakdown voltage. As an example, in order to obtain a reverse breakdown voltage of about 600 V, the thickness and carrier concentration may be set to about 7 µm to 8 µm and $1×10^{16}$ cm$^{-3}$. The carrier concentration is controlled by introducing a dopant functioning as an n-type carrier such as Si or Sn by a desired amount at the time of film formation. Thus, the gallium oxide substrate having the epitaxial layer 22 formed on the gallium oxide wafer W is completed (step S1).

Figure 5:
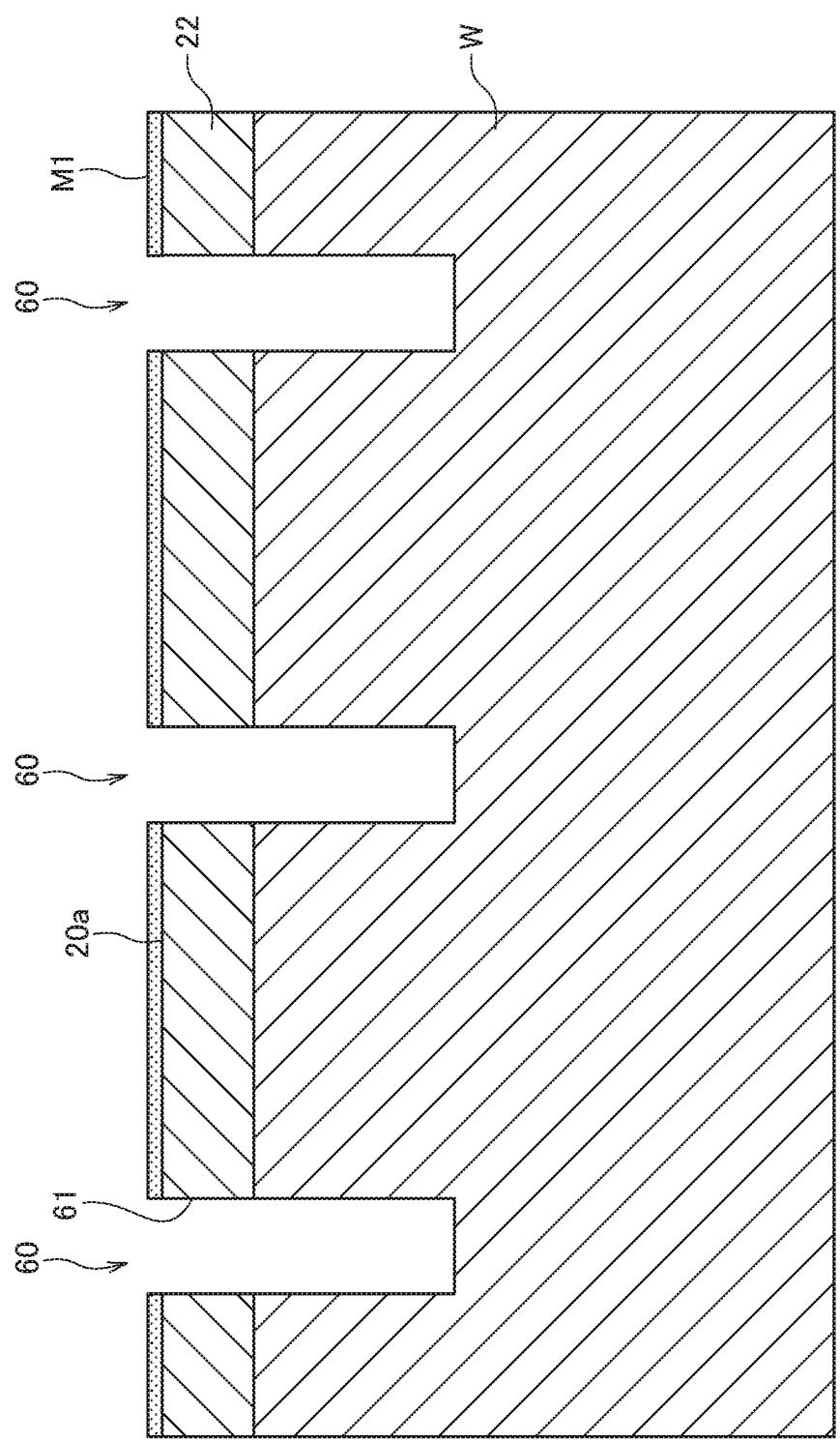
FIG. 5 is a cross-sectional view of the semiconductor device 10 during the manufacturing process.

Subsequently, as illustrated in FIG. 5, dry etching is performed with an element formation area of the first electrode forming surface 20a constituting the surface of the epitaxial layer 22 covered with an etching mask M1 to form a plurality of slits 60 in the gallium oxide substrate (step S2). The slits 60 are formed so as to penetrate the epitaxial layer 22 and to have a depth reaching the gallium oxide wafer W. Specifically, the depth of the slits 60 is made slightly larger than the final thickness of the semiconductor layer 20. For example, when the final thickness of the semiconductor layer 20 is 50 µm, the depth of the slits 60 is set to about 55 µm.

The slits 60 can be formed by an RIE method using chlorine-based gas such as $BCl_3$. Particularly, in order to reduce etching time, an ICP-RIE method enabling high-speed etching is preferably used. As the etching mask M1, a metal film such as nickel (Ni) that is not etched by chlorine-based gas is preferably used so as to increase selectivity with respect to, e.g., $Ga_2O_3$. In this case, the metal film serving as the etching mask M1 is formed to have a thickness of about 100 nm using an EB vapor deposition method or a sputtering method on the entire surface of the epitaxial layer 22 and is then patterned by photolithography. After that, dry etching is performed with the patterned etching mask M1 used as a mask to form the plurality of slits 60 in the gallium oxide substrate.

Figure 6A:
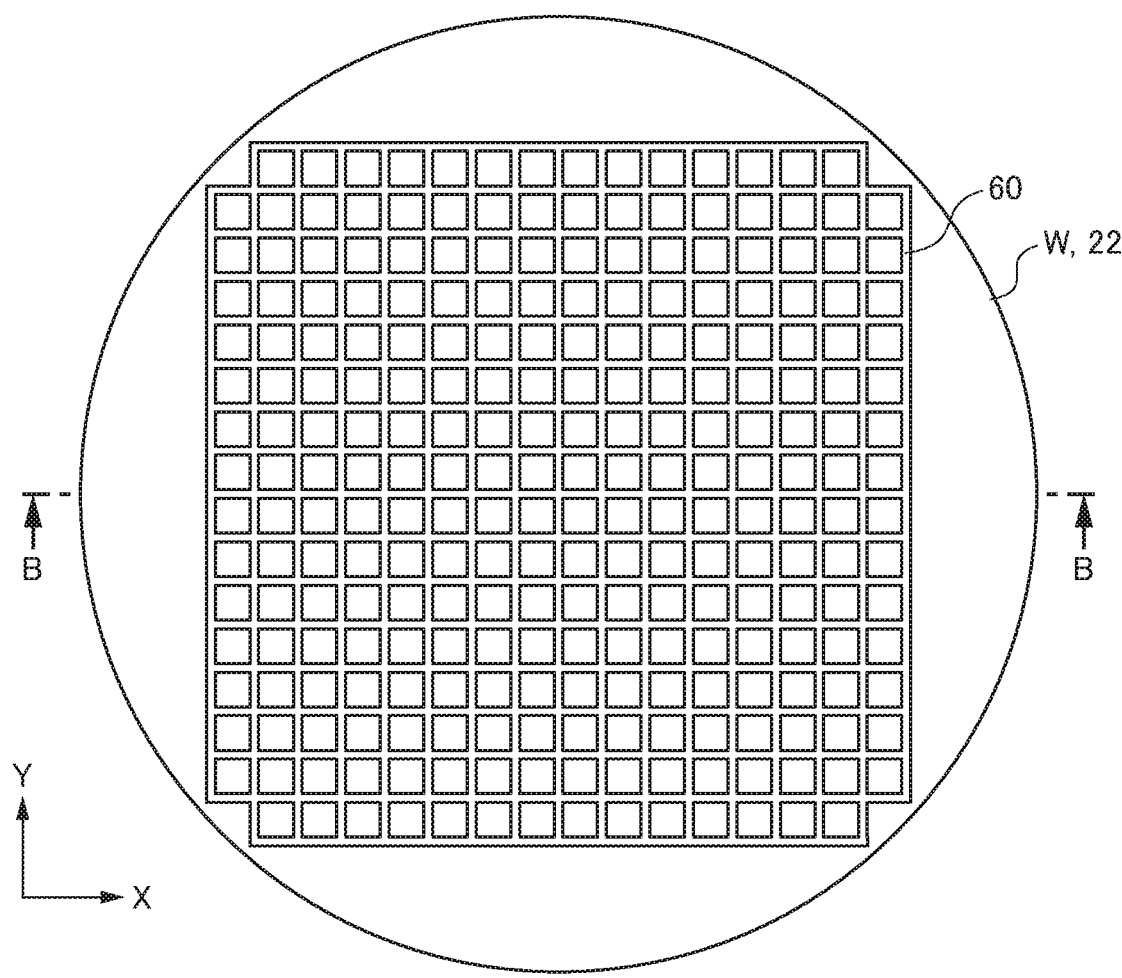
FIG. 6A is a plan view of the semiconductor device 10 during the manufacturing process.
Figure 6B:
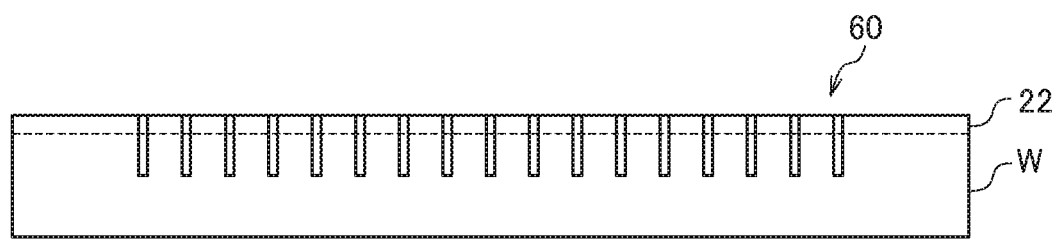
FIG. 6B is a schematic cross-sectional view taken along line B-B in FIG. 6A.

As illustrated in FIG. 6A as a plan view, the plurality of slits are formed so as to extend in the X- and Y-directions, and the rectangular areas surrounded by the slits 60 are each a part that finally becomes an element. FIG. 6B is a schematic cross-sectional view taken along line B-B in FIG. 6A. When, for example, the element size is 1 mm×1 mm, the slits 60 each having a width of 20 µm are formed in the X- and Y-directions at 1.02 mm pitch. After the formation of the slits 60, the etching mask M M1 is removed using a general acid-based etching liquid, followed by substrate cleaning.

The thus formed slits 60 have little damage in its inner wall 61, unlike those formed by machining using a dicing blade or the like. Further, the flatness of the inner wall 61 is very high, specifically, irregularity thereof is 1 µm or less, and the surface property thereof is almost uniform.

Figure 7:
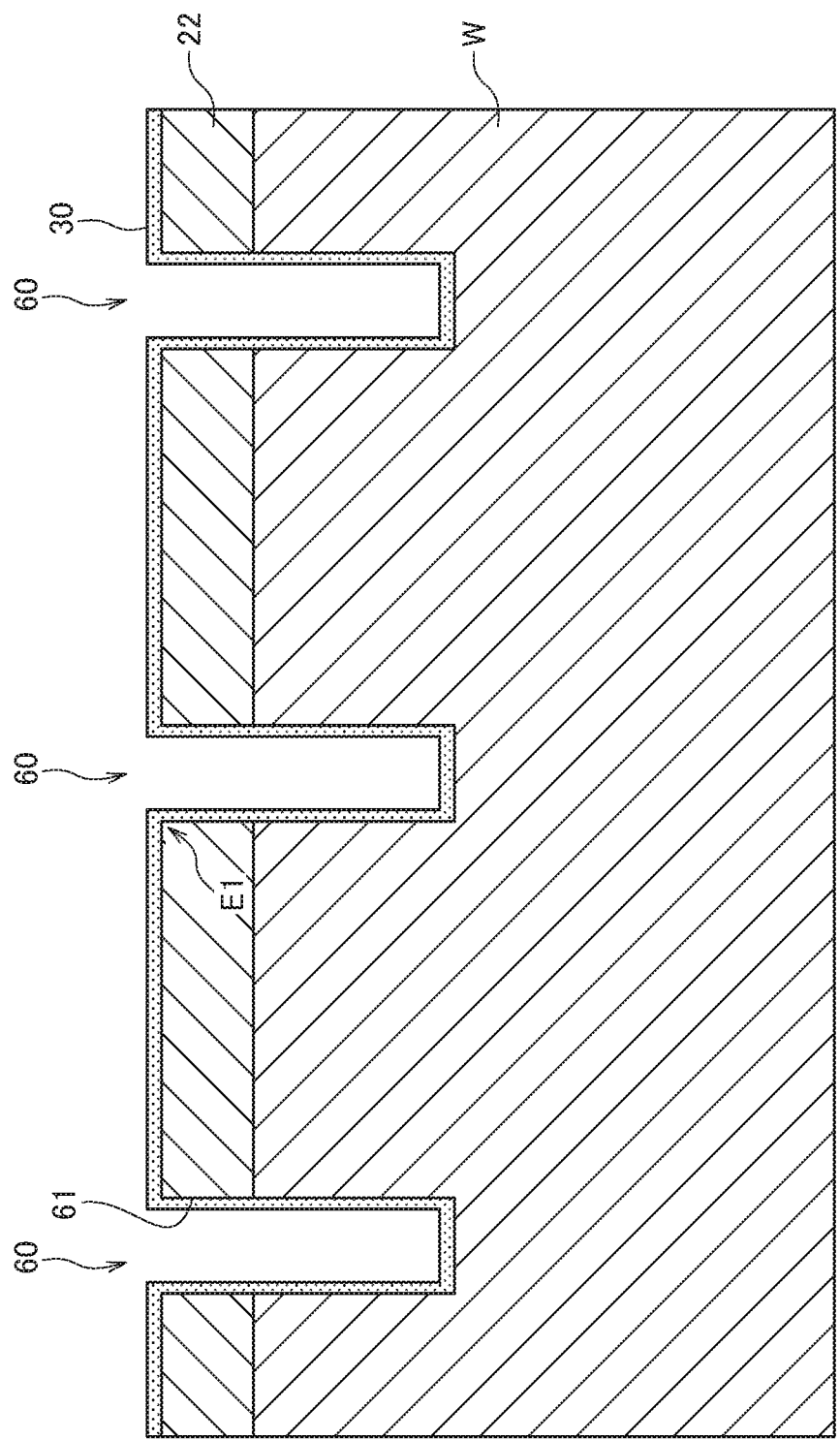
FIG. 7 is a cross-sectional view of the semiconductor device 10 during the manufacturing process.

Subsequently, as illustrated in FIG. 7, the insulating film 30 made of $SiO_2$, $Si_3N_4$, $Al_2O_3$, $HfO_2$ or the like is formed on the surface of the epitaxial layer 22 and the inner walls of the respective slits 60 (step S3). The insulating film 30 is preferably formed by a film formation method excellent in coverage, such as an ALD method or a CVD method, whereby not only the surface of the epitaxial layer 22, but also almost the entire surface of the inner wall 61 of each slit 60 is covered with the insulating film 30. Also, each portion of first edge E1, the openings of the respective slits 60, are covered with the insulating film 30. Further, a plurality of film formation methods may be combined for lamination of the insulating film 30.

Figure 8:
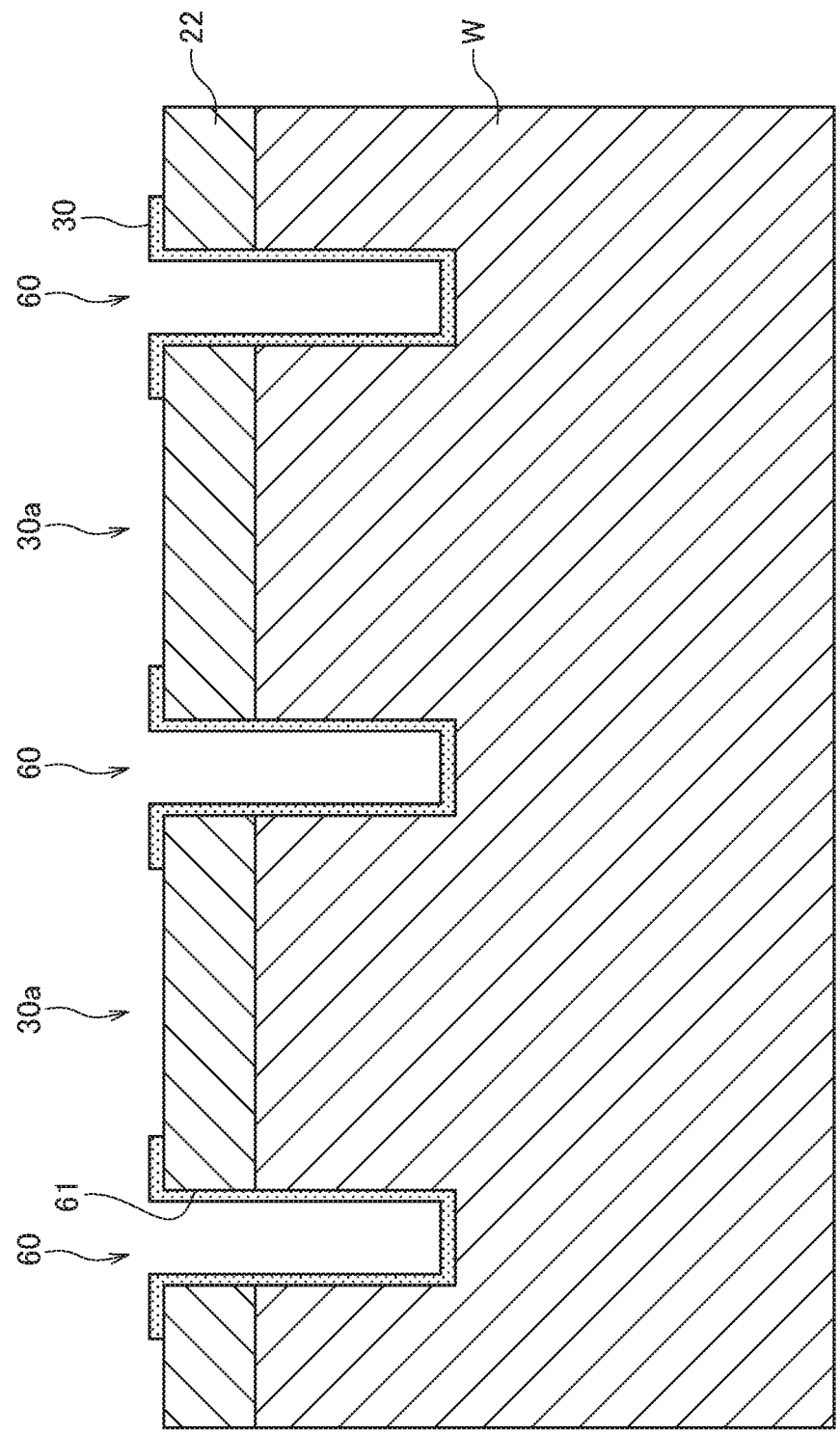
FIG. 8 is a cross-sectional view of the semiconductor device 10 during the manufacturing process.
Figure 9:
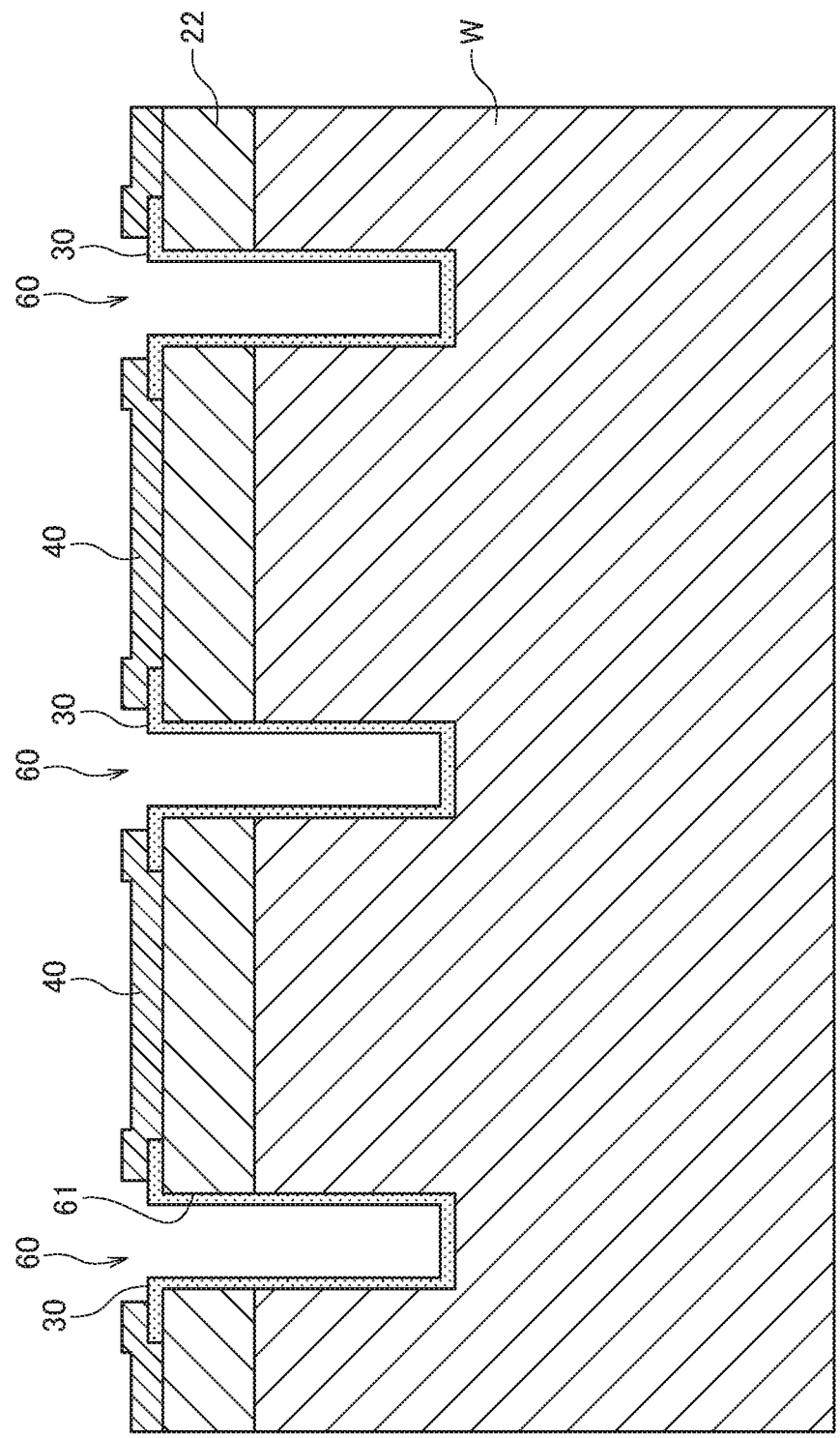
FIG. 9 is a cross-sectional view of the semiconductor device 10 during the manufacturing process.

Subsequently, the opening 30a is formed in the insulating film 30 as illustrated in FIG. 8, and then the anode electrode 40 is formed as illustrated in FIG. 9 (step S4). The opening 30a is formed by patterning a resist by a normal photolithography method, and then by applying dry etching or wet etching to the insulating film 30 with the resist used as a mask. However, the plurality of slits 60 are formed in the gallium oxide substrate at this point, so that a film-type solid resist is more preferably used as the resist than a coating-type liquid resist.

The anode electrode 40 can be formed by a vapor deposition method and patterned using a lift-off process. That is, a resist pattern having a planar size larger by about 5 µm than that of the opening 30a of the insulating film 30 is formed, and then platinum (Pt), titanium (Ti) and aluminum (Al) are formed to have thicknesses of 50 nm, 5 nm and 1 µm, respectively, by vapor deposition. Then, the resist pattern is removed, whereby the metal layer formed on the resist pattern can be removed together with the rest pattern. In order to prevent the metal film from adhering to the inside of the slit 60, a film-type solid resist is preferably used. Alternatively, in place of patterning the anode electrode 40 formed on the entire surface, vapor deposition may be performed through a lattice-like metal mask to selectively form the anode electrode 40. However, in the present embodiment, the inner wall 61 of the slit 60 is covered with the insulating film 30, so that even when a small amount of the metal material enters the slit 60, it does not contact the gallium oxide substrate.

Figure 10:
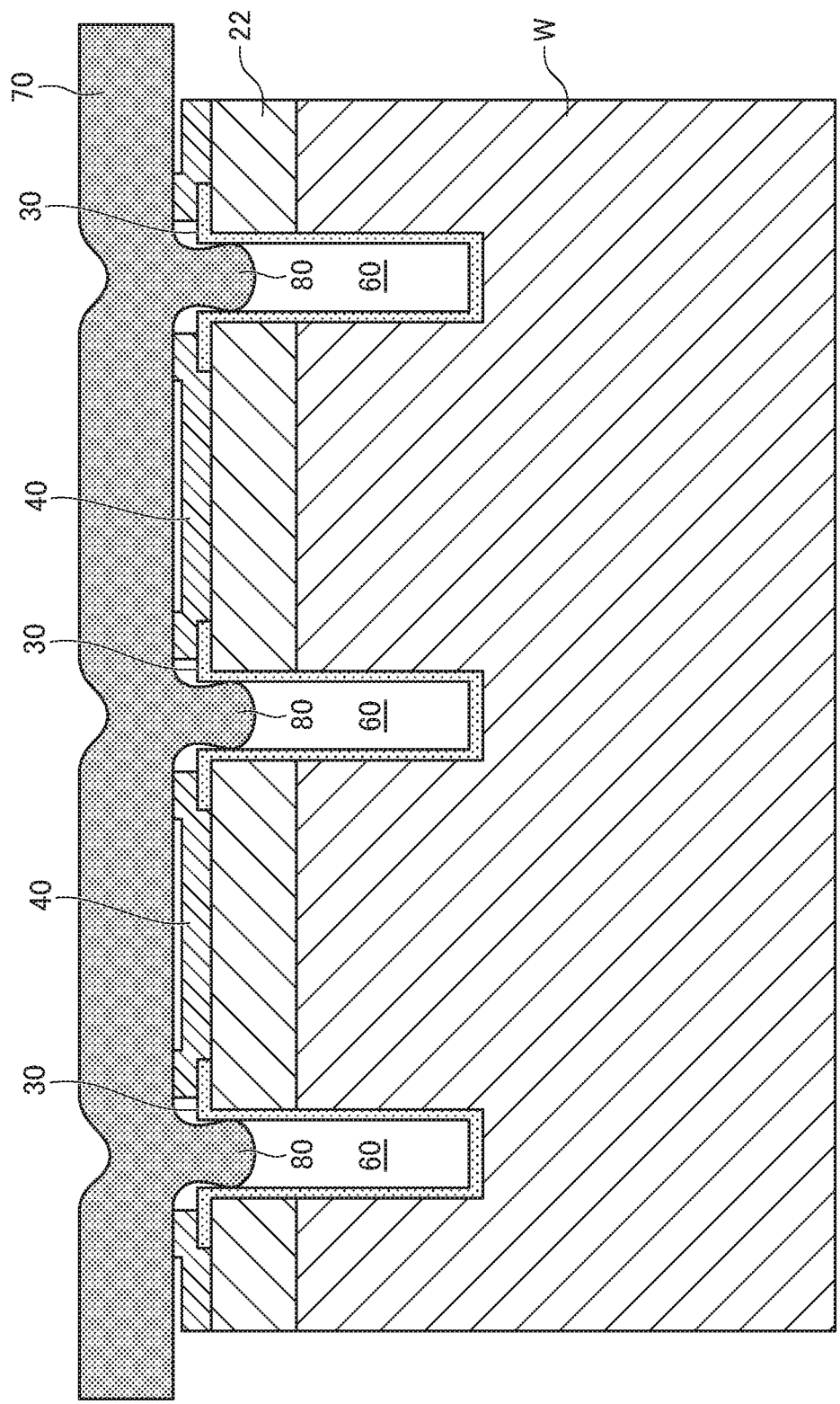
FIG. 10 is a cross-sectional view of the semiconductor device 10 during the manufacturing process.

Subsequently, as illustrated in FIG. 10, a flexible support member 70 is stuck onto the surface of the gallium oxide substrate (step S5). As the flexible support member 70, a member having high flexibility like a thick resin film is preferably used. By applying a certain pressure to the highly flexible support member 70 on the surface of the gallium oxide substrate, the support member 70 is deformed and partly serves as a protective member 80 buried in the slit 60. By the protective member 80, the anode electrode 40 is spatially isolated from the slit 60.

Figure 11:
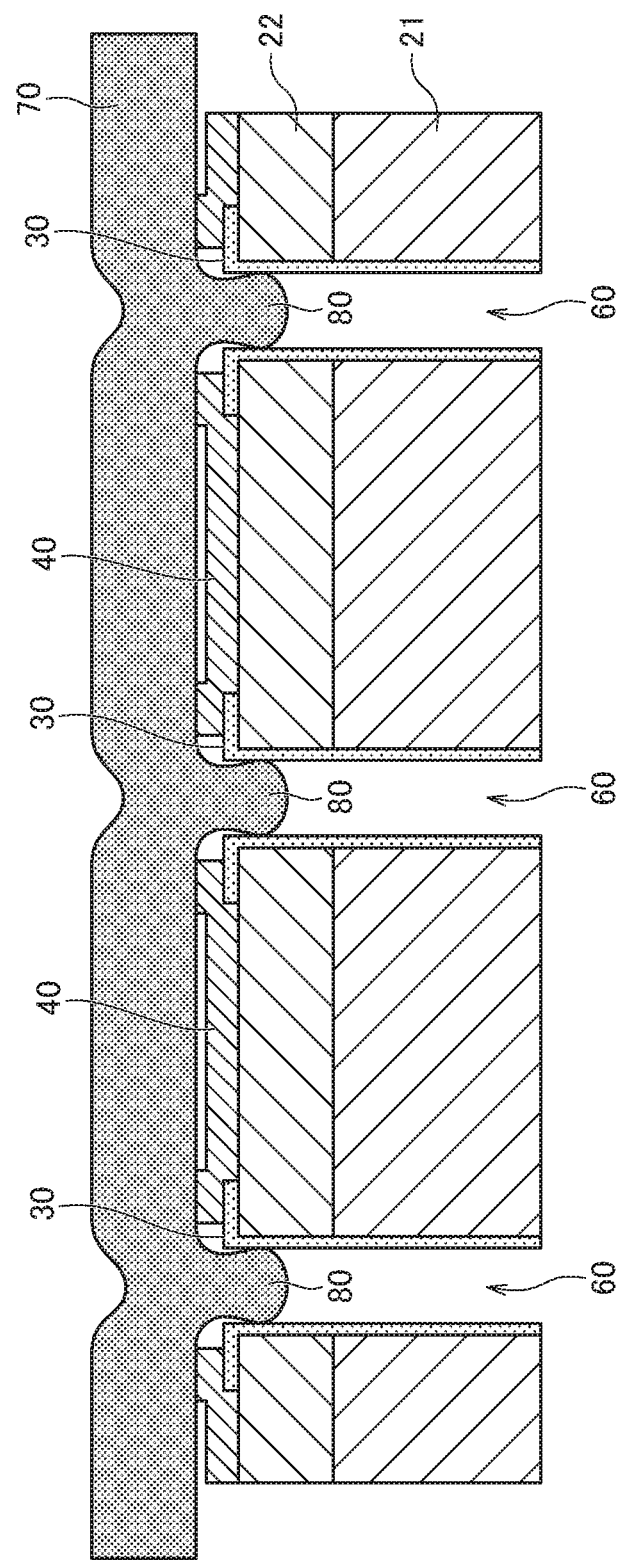
FIG. 11 is a cross-sectional view of the semiconductor device 10 during the manufacturing process.

Subsequently, as illustrated in FIG. 11, the back side, i.e., the lower surface of the gallium oxide wafer W is ground and polished with the gallium oxide substrate supported by the support member 70 (step S6). The grinding and polishing can be conducted in the same manner as for a general silicon substrate. The gallium oxide wafer W is ground and polished up to the slit 60, whereby the gallium oxide substrate including the semiconductor substrate 21 and epitaxial layer 22 is singulated into a plurality of individual pieces. After the grinding and polishing, cleaning is performed to clean the polished surface. Although both the grinding and polishing are performed for singulation in the above description, the grinding may be omitted.

Figure 12:
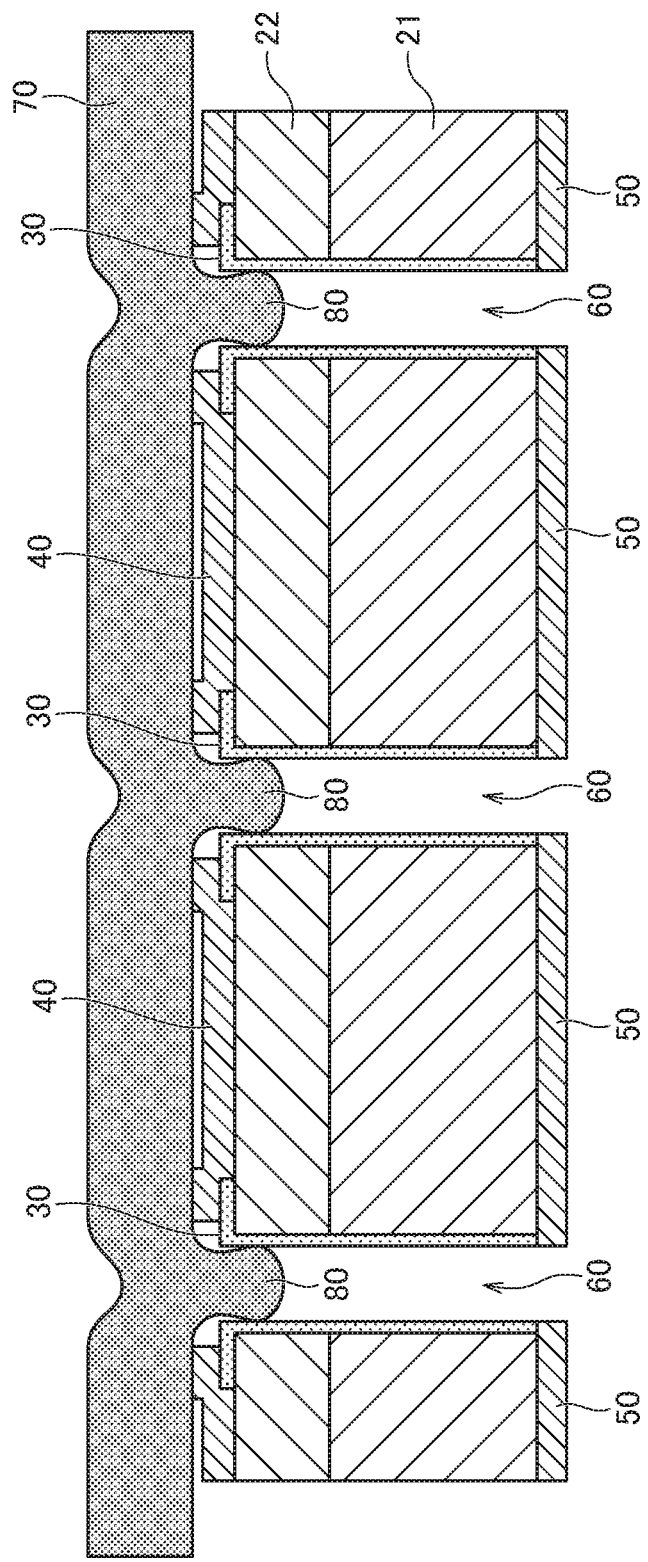
FIG. 12 is a cross-sectional view of the semiconductor device 10 during the manufacturing process.

Subsequently, as illustrated in FIG. 12, the cathode electrode 50 is formed on the lower surface of the semiconductor substrate 21 made of gallium oxide (step S7). The cathode electrode 50 is preferably formed using a thin-film formation method with low coverage, such as a vapor deposition method or a sputtering method. As a result, the cathode electrode 50 is properly formed on the lower surface of the semiconductor substrate 21, while an electrode material hardly gets into the inner wall 61 of the slit 60 to substantially prevent the electrode from being formed on the inner wall 61. Although a part of the electrode material of the cathode electrode 50 enters the slit 60, since the upper portion of the slit 60 is filled with the protective member 80 formed of a part of the support member 70 as illustrated in FIG. 12, the electrode material of the cathode electrode 50 by no means reaches the anode electrode 40. In order to prevent the electrode material from entering the slit 60, it is preferable to perform vapor deposition with the slit 60 covered with a lattice-shaped metal mask or the like to selectively form the cathode electrode 50 on the lower surface of the semiconductor substrate 21.

Figure 13:
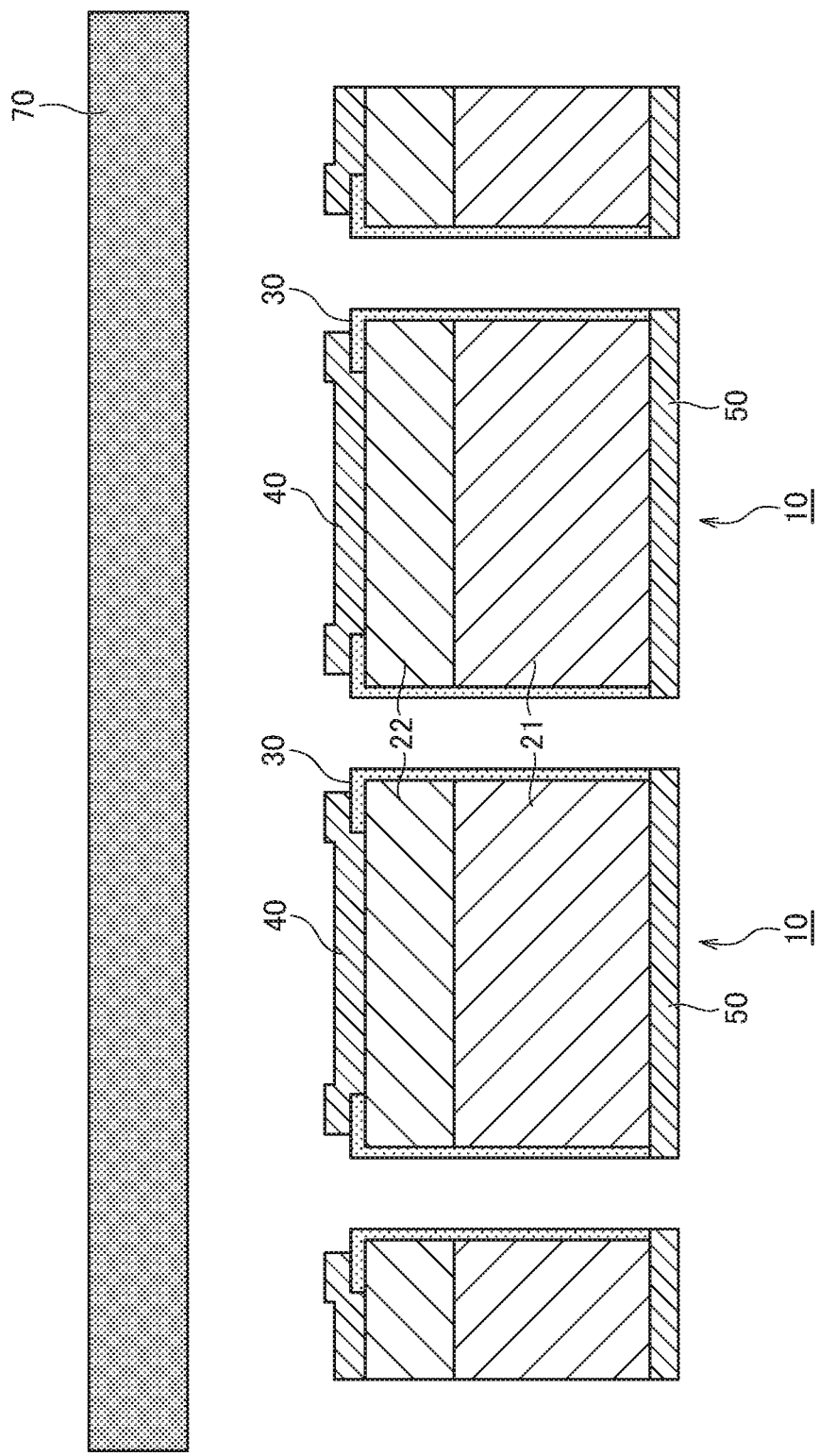
FIG. 13 is a cross-sectional view of the semiconductor device 10 during the manufacturing process.

Then, as illustrated in FIG. 13, the support member 70 is removed, whereby a plurality of the semiconductor devices 10 are completed (step S8). Each individual semiconductor device 10 is mounted in a package as needed. The package has a base plate made of copper (Cu) or the like, and the base plate and the cathode electrode 50 of the semiconductor device 10 are connected through a solder. The anode electrode 40 of the semiconductor device 10 is connected to a lead frame of the package through a bonding wire.

Thus, according to the manufacturing method for the semiconductor device 10 of the present embodiment, dry etching is performed to form the plurality of slits 60 on the upper surface side of the gallium oxide substrate, and then the lower surface side of the gallium oxide substrate is ground and polished to singulate the substrate, thereby preventing the side surfaces 20c of the semiconductor layer 20 from being mechanically damaged. Thus, unlike a case where the substrate is singulated using a dicing blade or the like, cracking, chipping, cleavage and other defects do not occur in the side surfaces 20c. Particularly, in β-Ga$_2$O$_3$, a (100) plane and a (001) plane have cleavability, so that in a case where the electrode forming surfaces 20a and 20b are (001) planes of β-Ga$_2$O$_3$, many horizontal cleavages may occur in the side surfaces 20c when the substrate is singulated using a dicing blade or the like. When such cleavages occur, not only device characteristics may be changed, but also gallium oxide powder resulting from the cleavage may be scattered. However, according to the manufacturing method for the semiconductor device 10 of the present embodiment, the side surfaces 20c are formed by dry etching, so that such cleavages hardly occur. Even if a small number of cleavages occur, the gallium oxide powder is not scattered since the side surfaces 20c are covered with the insulating film 30. Further, gallium oxide has low heat conductivity, so that heat generated due to forward current is not efficiently radiated to easily cause element degradation. However, in the present embodiment, the thickness of the semiconductor layer 20 is reduced by polishing the back surface of the gallium oxide wafer W, so that heat radiation performance can be improved.

In addition, the insulating film 30 is formed also on the inner wall 61 of the slit 60 simultaneously when the insulating film 30 is formed for the purpose of obtaining the field plate structure, so that it is possible to form the insulating film 30 both on the first electrode forming surface 20a and on the inner wall 61 of the slit 60 without involving an increase in the number of processes. Thus, the insulating film 30 (first part 31) formed on the first electrode forming surface 20a and the insulating film 30 (second part 32) formed on the side surfaces 20c are formed simultaneously, so that they are formed seamlessly. This makes it possible to effectively suppress a leak current flowing along the side surfaces 20c.

Figure 14:
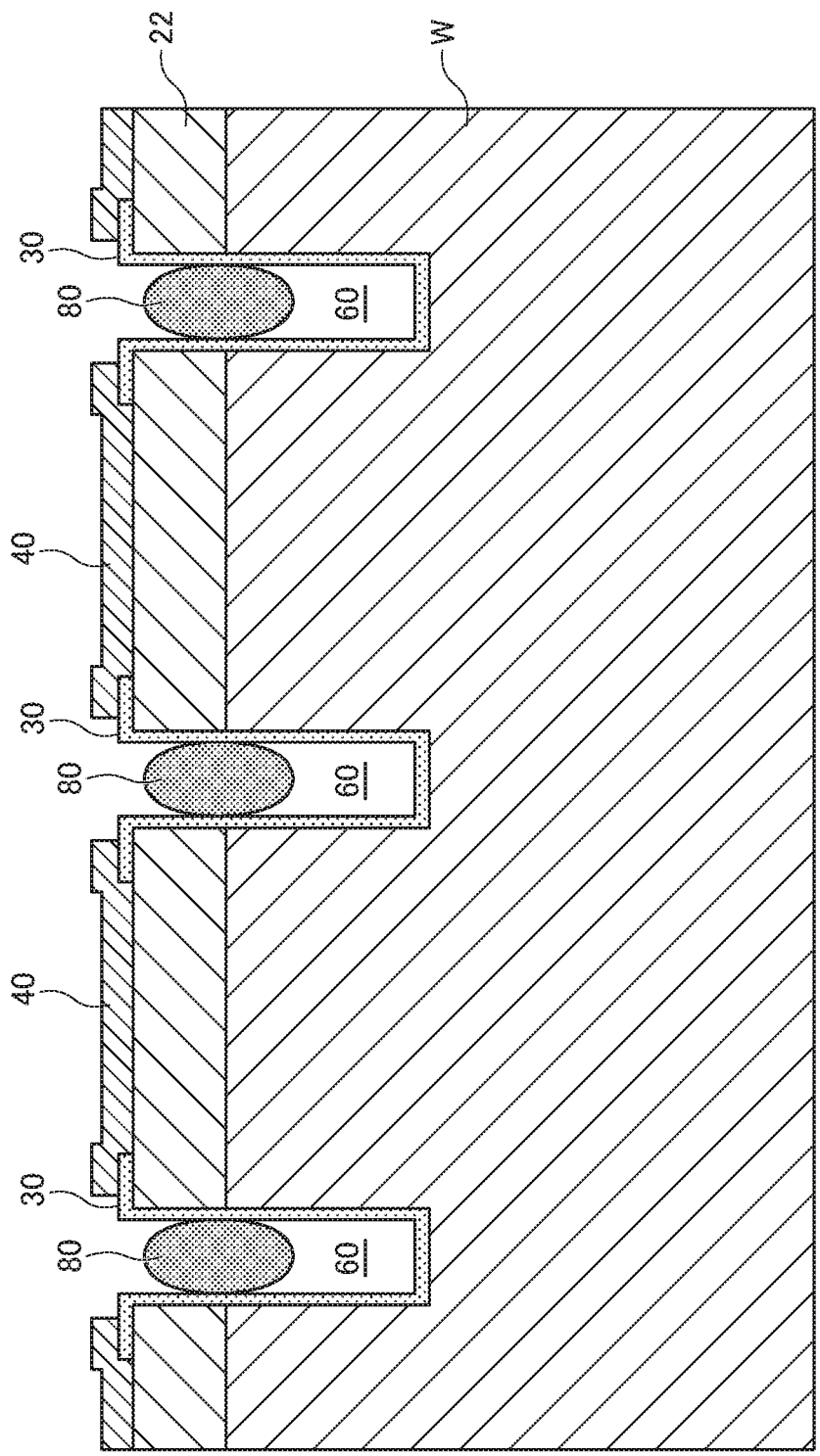
FIG. 14 is a cross-sectional view for explaining the manufacturing process of a modification of the semiconductor device 10.

In the above-described manufacturing method, the protective member 80 formed of a part of the flexible support member 70 is buried in the upper portion of the slit 60; however, when a support member 70 having high rigidity, i.e., having low flexibility is used, a protective member separated from the support member 70 may be buried in the slit 60 after formation of the slit 60 and before singulation of the gallium oxide substrate, as illustrated in FIG. 14. Alternatively, the protective member 80 may be buried after singulation of the gallium oxide substrate and before formation of the cathode electrode 50. At any rate, as far as the protective member 80 is buried in the slit 60 at the time of formation of the cathode electrode 50, the electrode material of the cathode electrode 50 does not reach the anode electrode 40 even if it enters the slit 60.

Figure 15:
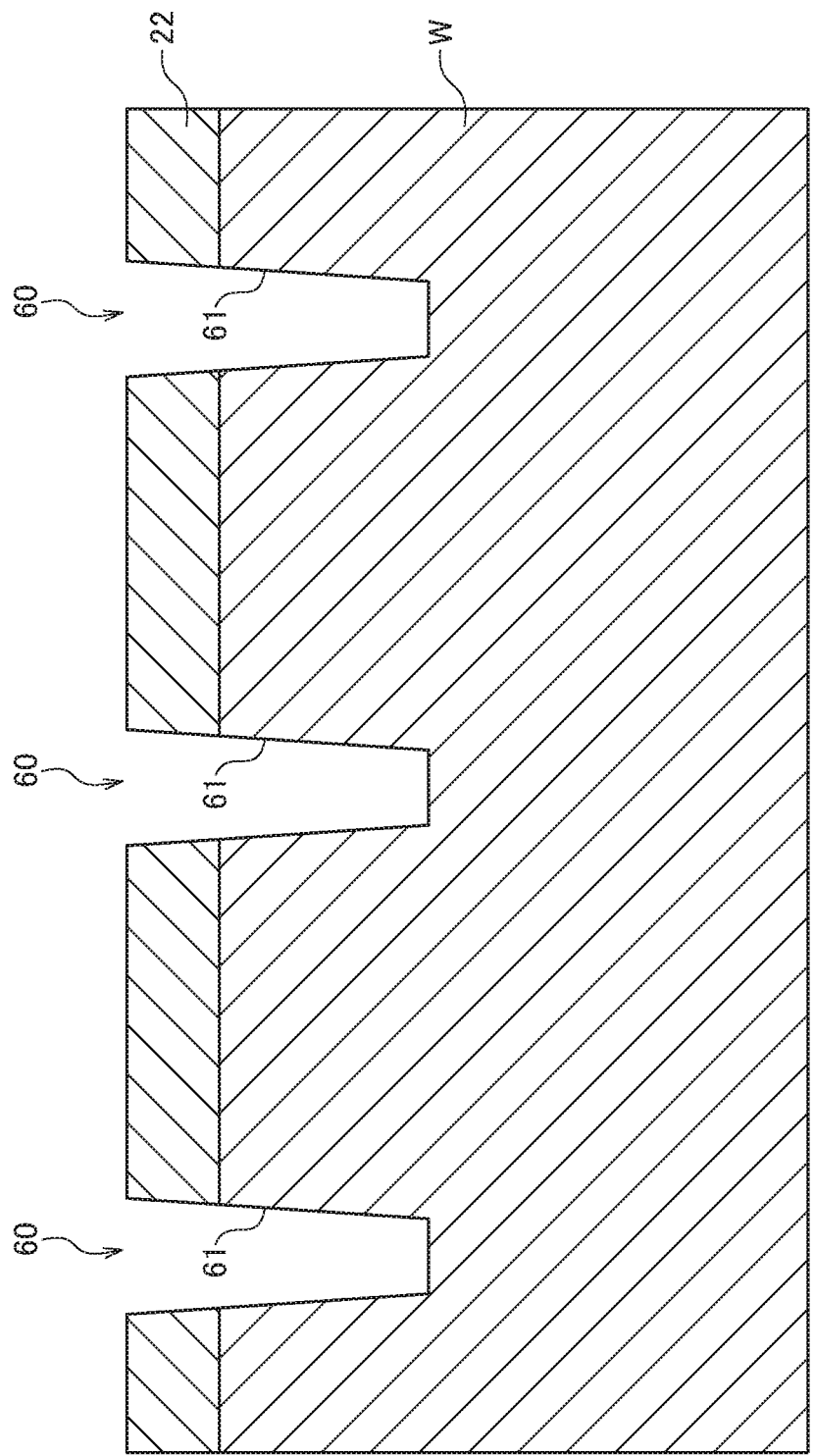
FIG. 15 is a cross-sectional view for explaining the manufacturing process of a modification of the semiconductor device 10.
Figure 16:
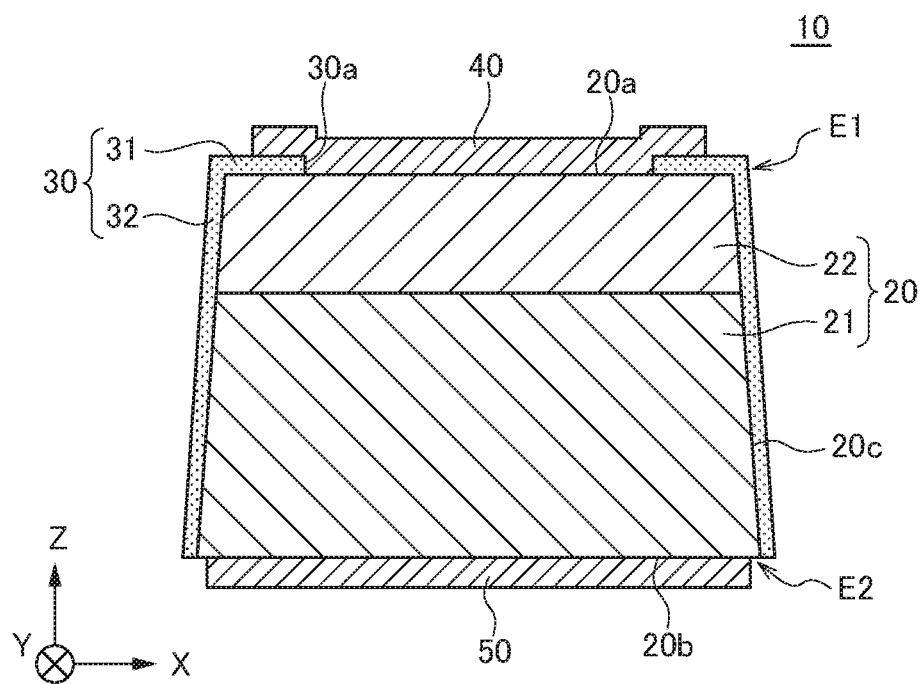
FIG. 16 is a cross-sectional view illustrating the semiconductor device 10 in which a cross section is tapered.

Further, in the formation process (step S2) of the slits 60, each slit 60 may be formed into a forward tapered shape as illustrated in FIG. 15 by adjusting dry etching conditions. The forward tapered shape refers to a shape in which the slit width is gradually reduced in the depth direction. This facilitates formation of the insulating film 30 on the inner wall 61 of the slit 60 in the formation process (step S3) of the insulating film 30. When the slit 60 having such a forward tapered shape is formed, the semiconductor device 10 finally obtained has a tapered shape in which the XY cross section of the semiconductor layer 20 is increased from the first electrode forming surface 20a toward the second electrode forming surface 20b, as illustrated in FIG. 16. This contributes to improvement in mounting stability on the package.

While the preferred embodiments of the present invention have been described, the present invention is not limited to the above embodiments and may be implemented in various forms without departing from the sprit and the scope of the invention.

For example, although the present invention is applied to a Schottky barrier diode in the above embodiment, the present invention is not limited to this and can be applied to other types of semiconductor devices provided that they are vertical semiconductor devices in which current flows in the thickness direction of the substrate.

Further, although gallium oxide is used as the material of the semiconductor layer in the above embodiment, the present invention is not limited to this.

REFERENCE SIGNS LIST 10 semiconductor device
20 semiconductor layer
20a first electrode forming surface
20b second electrode forming surface
20c side surface
21 semiconductor substrate
22 epitaxial layer
30 insulating film
30a opening
31 first part
32 second part
40 anode electrode
50 cathode electrode
60 slit
61 inner wall
70 support member
80 protective member
E1 first edge
E2 second edge
M1 etching mask
W gallium oxide wafer

What is claimed is:
1. A semiconductor device comprising:
a semiconductor layer including a first electrode forming surface, a second electrode forming surface positioned opposite to the first electrode forming surface, and a side surface having a first edge as a boundary with the first electrode forming surface and a second edge as a boundary with the second electrode forming surface;
a first electrode formed on the first electrode forming surface;

a second electrode formed on the second electrode forming surface; and
an insulating film continuously formed from the first electrode forming surface to the side surface so as to cover the first edge,
wherein an entirety of the side surface of the semiconductor layer is covered with the insulating film, while a side surface of the second electrode is not covered with the insulating film,
wherein the semiconductor layer comprises:
a semiconductor substrate having the second electrode forming surface; and
an epitaxial layer formed on the semiconductor substrate and having the first electrode forming surface,
wherein at least a part of the first electrode is in Schottky-contact with the epitaxial layer, and the second electrode is in ohmic contact with the semiconductor substrate, and
wherein the semiconductor layer comprising the semiconductor substrate and the epitaxial layer entirely has a tapered shape so that a cross sectional area of the semiconductor layer decreases from the second electrode forming surface and the second edge of the side surface toward the first electrode forming surface and the first edge of the side surface.

2. The semiconductor device as claimed in claim 1, wherein another part of the first electrode is formed on the insulating film formed on the first electrode forming surface.

3. The semiconductor device as claimed in claim 1, wherein the semiconductor layer is made of gallium oxide.

4. The semiconductor device as claimed in claim 1,
wherein the side surface of the semiconductor layer includes a first side surface of the semiconductor substrate and a second side surface of the epitaxial layer, and
the first and second side surfaces are coplanar with each other from the first edge to the second edge.

5. A semiconductor device comprising:
a semiconductor substrate having a first surface, an second surface opposite the first surface, and a first side surface;
an epitaxial layer having a third surface that is in contact with the second surface of the semiconductor substrate, a fourth surface, opposite to the third surface, having a first area and a second area surrounding the first area, and a second side surface;
a first electrode that is in contact with the first area of the fourth surface of the epitaxial layer;
a second electrode that is in contact with the first surface of the semiconductor substrate; and
an insulating film covering the second area of the fourth surface of the epitaxial layer, the first side surface of the semiconductor substrate, and the second side surface of the epitaxial layer,
wherein the first and second side surfaces are inclined such that cross sectional areas of the semiconductor substrate and the epitaxial layer are increased from the fourth surface toward the first surface, and
wherein the first side surface and the second side surface are entirely coplanar with each other.

6. The semiconductor device as claimed in claim 5, wherein an entirety of the first and second side surfaces is covered with the insulating film.

7. The semiconductor device as claimed in claim 6, wherein a side surface of the second electrode is not covered with the insulating film.

* * * * *